United States Patent
Cho et al.

(10) Patent No.: US 10,678,359 B2
(45) Date of Patent: Jun. 9, 2020

(54) PATTERN STRUCTURE FOR PREVENTING VISIBILITY OF MOIRÉ AND DISPLAY APPARATUS USING THE PATTERN STRUCTURE

(71) Applicant: SAMSUNG ELECTRONICS CO., LTD., Suwon-si (KR)

(72) Inventors: Eunhyoung Cho, Hwaseong-si (KR); Bonwon Koo, Suwon-si (KR); Hyunjoon Kim, Seoul (KR); Haesung Kim, Hwaseong-si (KR); Jungyun Won, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/134,471

(22) Filed: Sep. 18, 2018

(65) Prior Publication Data

US 2019/0087044 A1    Mar. 21, 2019

(30) Foreign Application Priority Data

Sep. 19, 2017    (KR) ......................... 10-2017-0120518

(51) Int. Cl.
*G06F 3/041*    (2006.01)
*H01L 27/32*    (2006.01)
(Continued)

(52) U.S. Cl.
CPC ............ *G06F 3/0412* (2013.01); *G06F 3/044* (2013.01); *G06K 9/0002* (2013.01);
(Continued)

(58) Field of Classification Search
CPC ..... G06F 3/0412; G06F 3/044; G06K 9/0002; H01L 27/32; H01L 27/323; H01L 27/3234; H01L 27/3244
See application file for complete search history.

(56) References Cited

U.S. PATENT DOCUMENTS 8,599,150 B2    12/2013    Philipp
9,134,859 B2    9/2015    Jeon et al.
(Continued)

FOREIGN PATENT DOCUMENTS

CN    106775167 A    5/2017
KR    10-2014-0039353 A    4/2014
(Continued)

OTHER PUBLICATIONS

Communication dated Jan. 11, 2019, issued by the European Patent Office in counterpart European Application No. 18194090.9.
(Continued)

*Primary Examiner* — Nelson M Rosario
(74) *Attorney, Agent, or Firm* — Sughrue Mion, PLLC

(57) ABSTRACT

Provided are a pattern structure for preventing a moiré pattern from becoming visible, and a display apparatus using the same. The pattern structure includes a first element pattern including a plurality of first elements arranged regularly at a first pitch; a second element pattern including a plurality of second elements arranged regularly at a second pitch, the second element pattern being provided on the first element pattern; and a filling layer configured to fill gaps among the plurality of second elements, between adjacent ones thereof. A difference between transmittances of the second element and the filling layer is about 5% or less and thus, a moiré pattern occurring due to the overlapping of the first element pattern and the second element pattern may be prevented from becoming visible.

17 Claims, 19 Drawing Sheets

(51) Int. Cl.
*G06K 9/00* (2006.01)
*G06F 3/044* (2006.01)

(52) U.S. Cl.
CPC ........ *H01L 27/323* (2013.01); *H01L 27/3234* (2013.01); *H01L 27/3244* (2013.01)

(56) References Cited

U.S. PATENT DOCUMENTS

| | | | |
|---|---|---|---|
| 9,372,586 B2 | 6/2016 | Chen et al. | |
| 9,542,052 B2 | 1/2017 | Cheong et al. | |
| 9,557,871 B2 | 1/2017 | den Boer et al. | |
| 9,891,657 B2 | 2/2018 | Iwami | |
| 9,971,439 B2 | 5/2018 | Kira et al. | |
| 2010/0141608 A1* | 6/2010 | Huang | G06F 3/044 345/178 |
| 2015/0022740 A1* | 1/2015 | Lee | G06F 3/044 349/12 |
| 2016/0034075 A1* | 2/2016 | Lee | G09G 5/003 345/173 |

FOREIGN PATENT DOCUMENTS

| | | |
|---|---|---|
| KR | 10-2015-0115072 A | 10/2015 |
| KR | 10-1615949 B1 | 4/2016 |
| KR | 10-1706946 B1 | 2/2017 |
| KR | 10-1715467 B1 | 3/2017 |
| WO | 2015/146462 A1 | 10/2015 |

OTHER PUBLICATIONS

Rinu Abraham Maniyara et al., An antireflection transparent conductor with ultrlow optical loss (<2 %) and electrical resistance (<6Ωsq-1), Nature Communications, Dec. 19, 2016, pp. 1-8. (8 pages total).

* cited by examiner

PATTERN STRUCTURE FOR PREVENTING VISIBILITY OF MOIRÉ AND DISPLAY APPARATUS USING THE PATTERN STRUCTURE

CROSS-REFERENCE TO RELATED APPLICATION

This application claims priority from Korean Patent Application No. 10-2017-0120518, filed on Sep. 19, 2017, in the Korean Intellectual Property Office, the disclosure of which is incorporated herein in its entirety by reference.

BACKGROUND

1. Field

Structures and apparatuses consistent with example embodiments relate to a pattern structure for preventing a moiré pattern from becoming visible and a display apparatus using the pattern structure.

2. Description of the Related Art

There is a growing need for personal authentication using unique personal features such as fingerprints, voice, face, hands, or an iris. Such personal authentication has been mainly used in financial devices, access control systems, mobile devices, laptop computers, etc. Recently, as mobile devices such as smart phones, tablet personal computers (PCs), and smart watches have come into more widespread use, a fingerprint recognition device has been employed to perform personal authentication so as to protect a large amount of security information stored in a mobile devices.

For design purposes or user convenience, display apparatuses including a fingerprint recognition device capable of directly performing fingerprint recognition on a display panel have been developed. Such a display apparatus has a structure in which a display panel with a pixel pattern having a regular arrangement of pixels and a fingerprint sensor with a sensor pattern having a regular arrangement of electrodes are vertically stacked. In this case, the pixel pattern and the sensor pattern may overlap each other and thus a moiré pattern may occur due to interference between the pixel pattern and the sensor pattern. The moiré pattern may distort an image and thus display quality may be degraded.

SUMMARY

One or more example embodiments may provide a pattern structure for preventing the appearance of a moiré pattern and a display apparatus using the pattern structure.

Additional example aspects and advantages will be set forth in part in the description which follows and, in part, will be apparent from the description, or may be learned by practice of the presented example embodiments.

According to an aspect of an example embodiment, a pattern structure for preventing a moiré pattern from becoming visible includes a first element pattern including a plurality of first elements arranged regularly at a first pitch; a second element pattern including a plurality of second elements arranged regularly at a second pitch, the second element pattern being provided on the first element pattern; and a filling layer configured to fill gaps among the plurality of second elements. A difference between transmittances of the second element and the filling layer is about 5% or less.

The first pitch and the second pitch may be values at which a moiré pattern becomes visible when the first element pattern and the second element pattern overlap each other without the filling layer.

The pattern structure may further include a transparent substrate between the first element pattern and the second element pattern. The filling layer may cover the plurality of second elements.

The plurality of second elements may have a transmittance of about 90% or more.

Each of the plurality of second elements may include a first oxide layer, a metal layer and a second oxide layer which are sequentially stacked.

According to an aspect of another example embodiment, a display apparatus includes a display panel including a pixel pattern having a plurality of pixels arranged regularly at a first pitch; and a first sensor provided on the display panel. The first sensor includes an electrode pattern including a plurality of electrodes arranged regularly at a second pitch; and a filling layer configured to fill gaps among the plurality of electrodes. A difference between transmittances of the plurality of electrodes and the filling layer is about 5% or less.

The first pitch and the second pitch may be values at which a moiré pattern becomes visible when the first element pattern and the second element pattern overlap each other without the filling layer. The first pitch of the pixel pattern may be about 100 µm or less. The second pitch of the electrode patterns may be about 1 mm or less.

The filling layer may cover the plurality of electrodes.

The plurality of electrodes may have a transmittance of about 90% or more and a sheet resistance of about 10 $\Omega sq^{-1}$ or less.

Each of the plurality of electrodes may include a first oxide layer, a metal layer and a second oxide layer which are sequentially stacked. The first oxide layer may include at least one material selected from a group consisting of an indium-tin oxide (ITO), an indium-zinc oxide (IZO), an Al-doped ZnO (AZO), a Ga-doped ZnO (GZO), an indium-tin-zinc oxide (ITZO), a zinc-tin oxide (ZTO), an indium-gallium oxide (IGO), $SnO_2$, $TiO_2$, $Nb_2O_5$, ZnO, $ZrO_2$ and $HfO_2$. The metal layer may include Ag or an Ag alloy.

The second oxide layer may include a same material as the first oxide layer or a material having a lower refractive index than that of the first oxide layer. The second oxide layer may include at least one material selected from a group consisting of an indium-tin oxide (ITO), an indium-zinc oxide (IZO), an Al-doped ZnO (AZO), a Ga-doped ZnO (GZO), an indium-tin-zinc oxide (ITZO), a zinc-tin oxide (ZTO), an indium-gallium oxide (IGO), $SnO_2$, and ZnO.

The filling layer may include an inorganic oxide or an organic insulating material.

The first sensor may include a fingerprint sensor or a fingerprint-touch composite sensor.

The display apparatus may further include a second sensor between the display panel and the first sensor.

The first sensor may include a fingerprint sensor. The second sensor may include a touch sensor.

BRIEF DESCRIPTION OF THE DRAWINGS

These and/or other example aspects and advantages will become apparent and more readily appreciated from the following description of example embodiments, taken in conjunction with the accompanying drawings in which.

DETAILED DESCRIPTION

Figure 1:
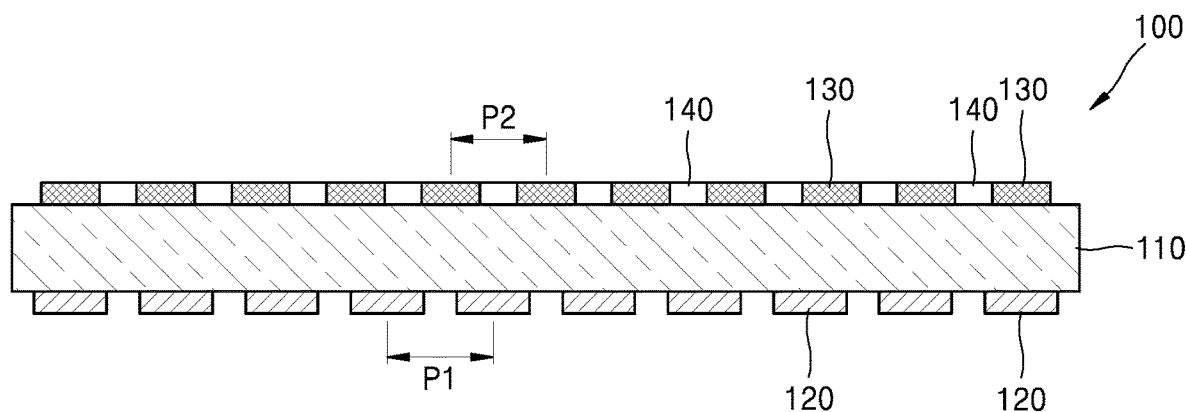
FIG. 1 illustrates a pattern structure for preventing a Moiré pattern from becoming visible, according to an example embodiment.

Reference will now be made in detail to example embodiments which are illustrated in the accompanying drawings, wherein like reference numerals refer to like elements throughout. In the drawings, the size of each element may be exaggerated for clarity and for convenience of explanation. Embodiments set forth herein are merely examples and various changes may be made therein. As used herein, the term "and/or" includes any and all combinations of one or more of the associated listed items. Expressions such as "at least one of," when preceding a list of elements, modify the entire list of elements and do not modify the individual elements of the list.

It will be understood that when an element or layer is referred to as being "on" another element or layer, the element or layer can be directly on another element or layer or intervening elements or layers. As used herein, the singular forms "a", "an" and "the" are intended to include the plural forms as well, unless the context clearly indicates otherwise. It will be further understood that when an element or layer is referred to as "including" another element or layer, the element or layer may further include other elements or layers unless mentioned otherwise. The term "the" and other demonstratives similar thereto should be understood to include a singular form and plural forms.

Figure 2:
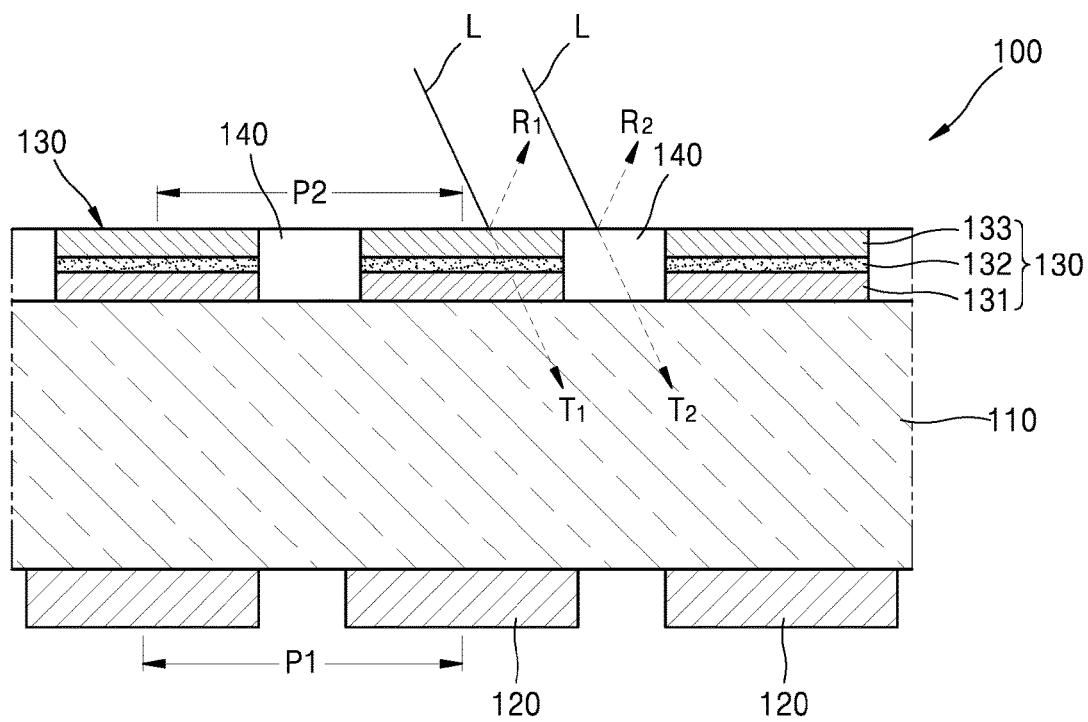
FIG. 2 is an enlarged view of a part of the pattern structure of FIG. 1.

FIG. 1 illustrates a pattern structure for preventing the visibility of moiré according to an example embodiment. FIG. 2 is an enlarged view of a part of the pattern structure of FIG. 1.

Referring to FIG. 1, a pattern structure 100 includes a first element pattern having a plurality of first elements 120, a second element pattern provided on the first element pattern and having a plurality of second elements 130, and a filling layer 140 provided among the second elements 130. In the first element pattern, the first elements 120 are regularly arranged at a first pitch P1. In the second element pattern, the second elements 130 are regularly arranged at a second pitch P2.

A transparent substrate 110 may be provided between the first element pattern and the second element pattern. The first element pattern may be provided on a bottom surface of the substrate 110. The second element pattern may be provided on a top surface of the substrate 110.

The filling layer 140 may fill gaps among the second elements 130 of the second element pattern. The filling layer 140 may be provided among the second elements 130, between adjacent ones thereof. The filling layer 140 may be formed to a same height as or to a lower height than that of the second elements 130.

The first pitch P1 of the first element pattern and the second pitch P2 of the second element pattern may be values at which a moiré pattern occurring due to the overlapping of the first element pattern and the second element pattern becomes visible when the filling layer 140 is not provided.

For example, in a high-resolution display apparatus having a fingerprint sensor, the first pitch P1 of the first element pattern may be equal to a pitch of a pixel pattern and the second pitch P2 of the second element pattern may be equal to a pitch of an electrode pattern. In this case, the first pitch P1 of the first element pattern may be about 100 μm or less. The second pitch P2 of the second element pattern may be a value, e.g., about 1 mm or less, at which a moiré pattern becomes visible due to the overlapping of the second element pattern and the first element pattern. As a concrete example, the second pitch P2 of the second element pattern may be about 100 μm or less, similar to the first pitch P1 of the first element pattern, but is not limited thereto.

In the present example embodiment, the filling layer 140 provided among the second elements 130, between adjacent ones thereof, may prevent the visibility of the moiré pattern which may occur due to the overlapping of the first and second element patterns. To this end, the difference between transmittances (or reflectances) of the second elements 130 and the filling layer 140 may be about 5% or less.

Some of the light incident on the second elements 130 may pass through the second elements 130 and another part of the incident light may be reflected by the second elements 130. Furthermore, some of the light incident on the filing layer 140, provided among the second elements 130, may pass through the filling layer 140 and another part of the incident light may be reflected by the filling layer 140. In FIG. 2, $T_1$ represents light passing through the second elements 130, $R_1$ represents light reflected by the second elements 130, $T_2$ represents light passing through the filling layer 140, and $R_2$ represents light reflected by the filling layer 140.

When the transmittance of the second element 130 and the transmittance of the filling layer 140 are similar, the second element pattern may not be visible. For example, when a difference between the transmittances of the second element 130 and the filling layer 140 is about 5% or less, the second element 130 and the filling layer 140 cannot be distinguished from each other by the naked eye and thus the second element pattern may not be visible. If the second element pattern is not visible as described above, a moiré pattern may not be visible even when the first element pattern and the second element pattern overlap each other.

A case in which the filling layer 140 having similar transmittance to those of the second elements 130 is provided among the second elements 130 to prevent the visibility of the moiré pattern has been described above. However, even when a filling layer (not shown) having similar transmittance to those of the first elements 120 is provided among the first elements 120, the visibility of the moiré pattern may be prevented.

The second element 130 may include, for example, an oxide-metal-oxide (OMO) material. In detail, the second element 130 may include a first oxide layer 131, a metal layer 132 and a second oxide layer 133 (i.e., a first oxide layer/metal layer/second oxide layer) which are sequentially stacked. The OMO material may have a transmittance of 90% or more and a sheet resistance of 10 $\Omega sq^{-1}$ or less.

The first oxide layer 131 may include an oxide having a refractive index of about 2.0 to 2.7 and a thickness of about 18 nm to 50 nm. As a concrete example, the first oxide layer 131 may include, but is not limited to, at least one material from among an indium-tin oxide (ITO), an indium-zinc oxide (IZO), an Al-doped ZnO (AZO), a Ga-doped ZnO (GZO), an indium-tin-zinc oxide (ITZO), a zinc-tin oxide (ZTO), an indium-gallium oxide (IGO), $SnO_2$, $TiO_2$, $Nb_2O_5$, ZnO, $ZrO_2$ and $HfO_2$.

The metal layer 132 may have a thickness less than that of each the first and second oxide layers 131 and 133, e.g., a thickness of about 5 nm to 10 nm. As a concrete example, the metal layer 132 may include Ag or an Ag alloy. Here, the Ag alloy may include, but is not limited to, a binary metal system such as Ag—Al, Ag—Mo, Ag—Au, Ag—Pd, Ag—Ti, or Ag—Cu or a ternary metal system such as Ag—Au—Pd or Ag—Au—Cu.

The second oxide layer 133 may include the same material as the first oxide layer 131 or a material having a lower refractive index than that of the first oxide layer 131. The second oxide layer 133 may include an oxide having a refractive index of about 1.8 to 2.2 and a thickness of about 35 nm to 53 nm. As a concrete example, the second oxide layer 133 may include at least one material from among an indium-tin oxide (ITO), an indium-zinc oxide (IZO), an Al-doped ZnO (AZO), a Ga-doped ZnO (GZO), an indium-tin-zinc oxide (ITZO), a zinc-tin oxide (ZTO), an indium-gallium oxide (IGO), $SnO_2$, and ZnO, but is not limited thereto.

As described above, the filling layer 140 provided among the second elements 130 may include a material having similar transmittance to that of the second elements 130 to prevent the visibility of the second element pattern. In detail, when the second elements 130 include an OMO material, the filling layer 140 may include an insulating material having a refractive index of about 1.6 to 2.0. As a concrete example, the filling layer 140 may include an inorganic oxide such as MgO, $Ta_2O_3$, SiON, or $SiO_2$ or an inorganic insulating material.

Figure 3:
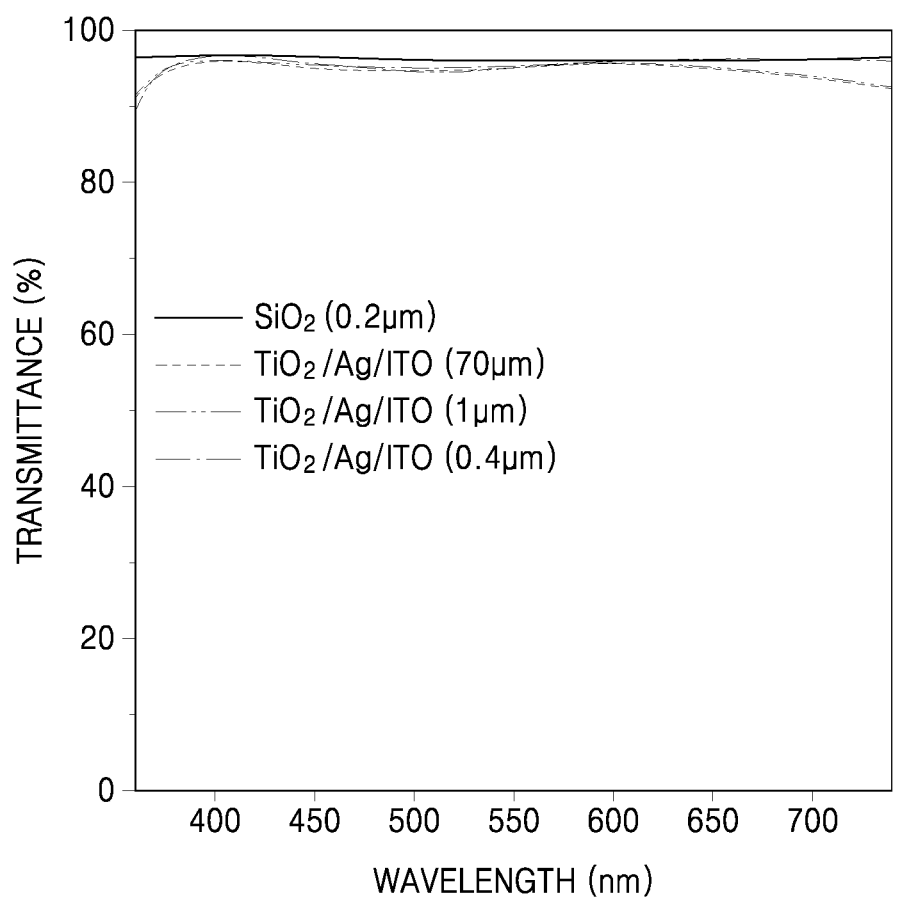
FIG. 3 is a graph showing transmittances of $TiO_2$/Ag/ITO and $SiO_2$.

FIG. 3 is a graph showing transmittances of $TiO_2$/Ag/ITO and $SiO_2$. Referring to FIG. 3, $TiO_2$/Ag/ITO, which is an OMO material, was used at thicknesses of 0.4 μm, 1 μm and 70 μm, and $SiO_2$ was used at a thickness of 0.2 μm. Referring to FIG. 3, both $TiO_2$/Ag/ITO and $SiO_2$ had a transmittance of 90% or more, and the transmittance of $TiO_2$/Ag/ITO and the transmittance of $SiO_2$ were substantially the same. Thus, when, in the pattern structure 100 of FIG. 1, the second elements 130 are $TiO_2$/Ag/ITO and the filing layer 140 provided among the second elements 130 is $SiO_2$, the difference between the transmittances of $TiO_2$/Ag/ITO and $SiO_2$ is small and thus the second element pattern may not be visible.

As described above, in the pattern structure 100 according to the present example embodiment, the filing layer 140 having similar transmittance to those of the second elements 130 is provided among the second elements 130 of the second element pattern, between adjacent ones thereof, and thus the second element pattern may not be visible. Accordingly, the visibility of the moiré pattern, which may occur due to the overlapping of the first element pattern and the second element pattern, may be prevented.

Figure 4A:
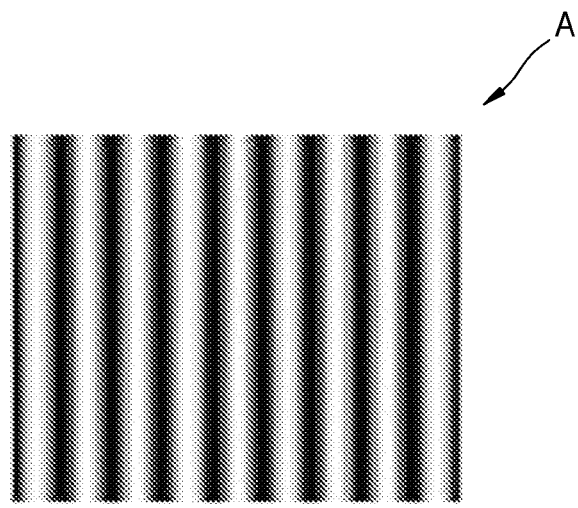
FIGS. 4A to 4C illustrate real-space patterns for explaining cases in which a moiré pattern occurs.
Figure 4B:
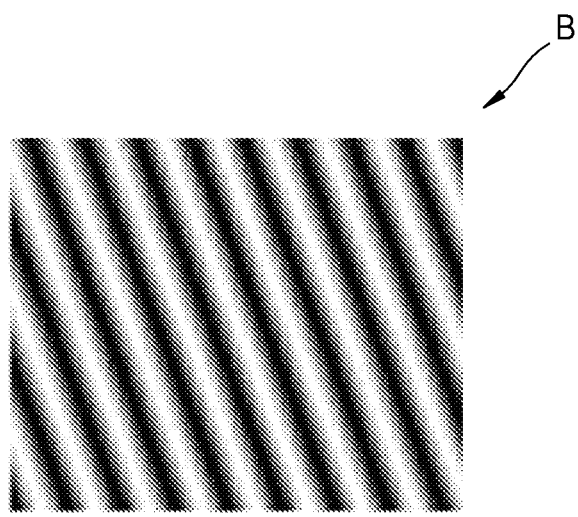
Figure 4C:
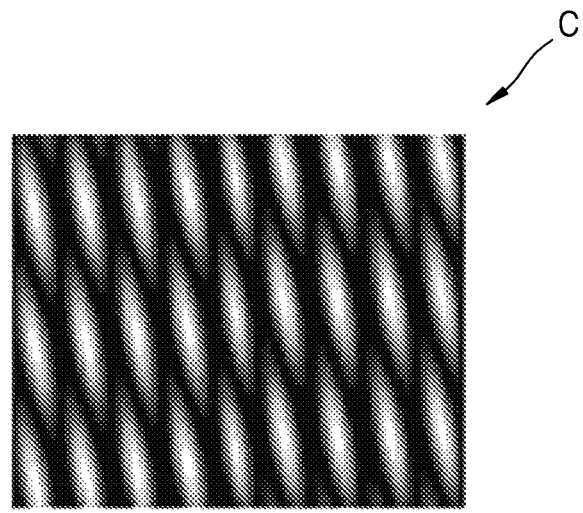
Figure 5A:
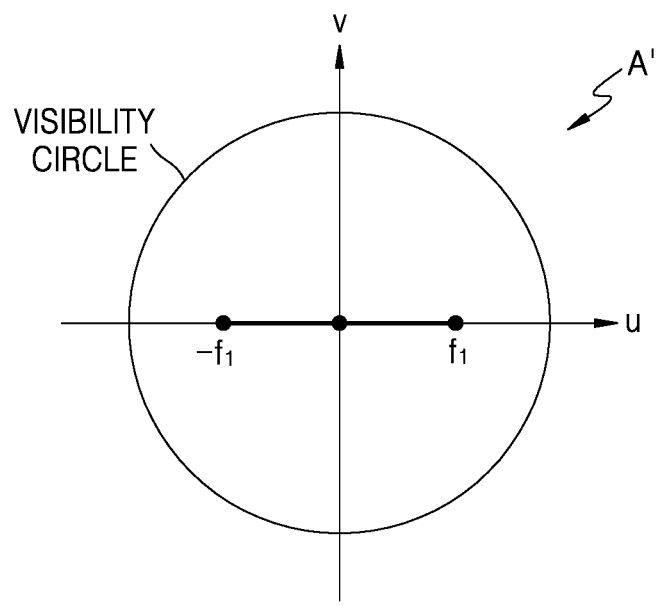
FIGS. 5A to 5C illustrate spatial frequency vector distributions in which the patterns of FIGS. 4A to 4C are expressed through Fourier transformation.
Figure 5B:
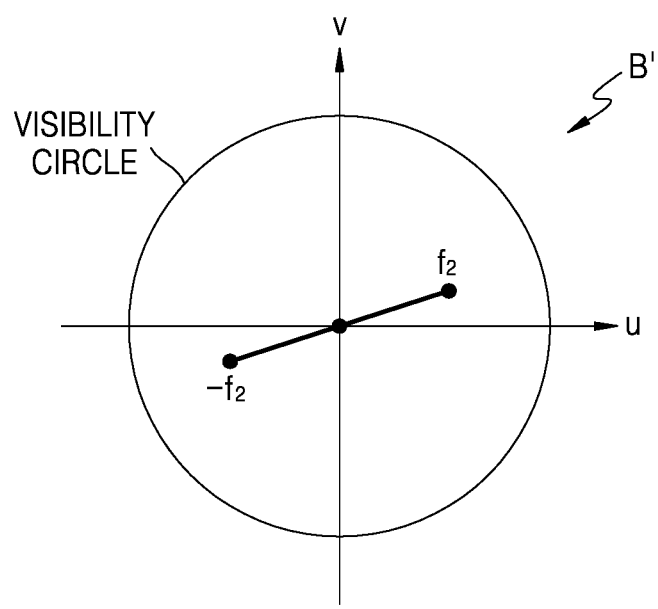
Figure 5C:
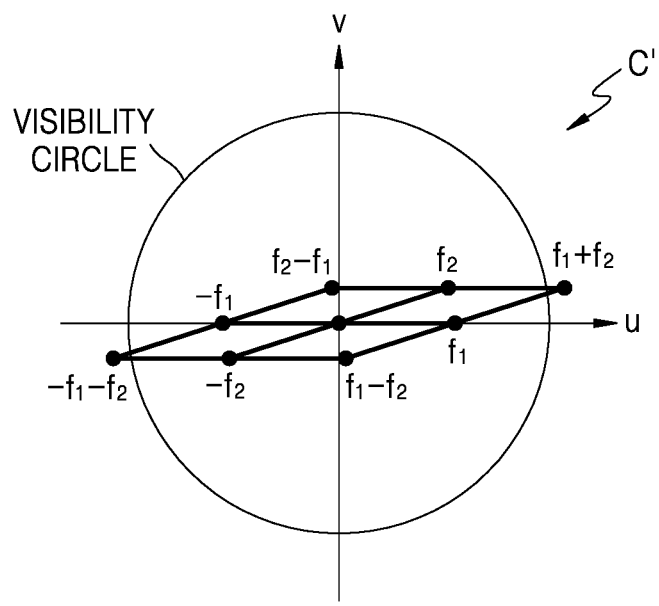

FIGS. 4A to 4C illustrate real-space patterns for explaining cases in which the moiré pattern is visible. FIGS. 5A to 5C illustrate spatial frequency vector distributions in which the patterns of FIGS. 4A to 4C are expressed through Fourier transform. In FIGS. 5A to 5C, u and v represent directions, and $f_1$ and $f_2$ respectively represent a first-direction frequency vector and a second-direction frequency vector. Furthermore, the visibility circle represents a critical pattern pitch (corresponding to 60 cycles/degrees) of a pattern distinguishable by a human eye. When a frequency vector is located outside the visibility circle, it is difficult for the frequency vector to be distinguished by the human eye, and thus is not recognized as a pattern.

FIG. 4A illustrates a first pattern A formed in a vertical direction. FIG. 5A illustrates a first spatial frequency vector distribution A' in which the first pattern A of FIG. 4A is expressed through Fourier transform. FIG. 4B illustrates a second pattern B tilted at a certain angle with respect to the vertical direction. FIG. 5B illustrates a second spatial frequency vector distribution B' in which the second pattern B of FIG. 4B is expressed through Fourier transform. In this case, the pitch of the first pattern A and the pitch of the second pattern B may be similar.

FIG. 4C illustrates a third pattern C formed by overlapping the first pattern A of FIG. 4A and the second pattern B of FIG. 4B with each other. FIG. 5C illustrates a third spatial frequency vector distribution C' obtained from the convolution sum of frequency vectors illustrated in FIG. 5A and frequency vectors illustrated in FIG. 5B.

Referring to FIG. 4C, the moiré pattern is visible in the third pattern C formed by overlapping the first pattern A and the second pattern B having similar pitches. The visibility of the moiré pattern may be also known from the third spatial frequency vector distribution C' of FIG. 5C, in which frequency vectors corresponding to the moiré pattern are located inside a visibility circle. As described above, the moiré pattern is visible when the first pattern A and the second pattern B having similar pitch overlap each other.

Figure 6A:
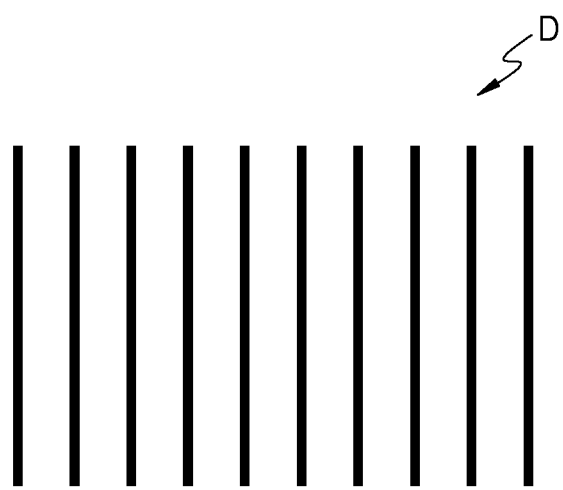
FIGS. 6A to 6C illustrate real-space patterns for explaining cases in which a moiré pattern does not occur.
Figure 6B:
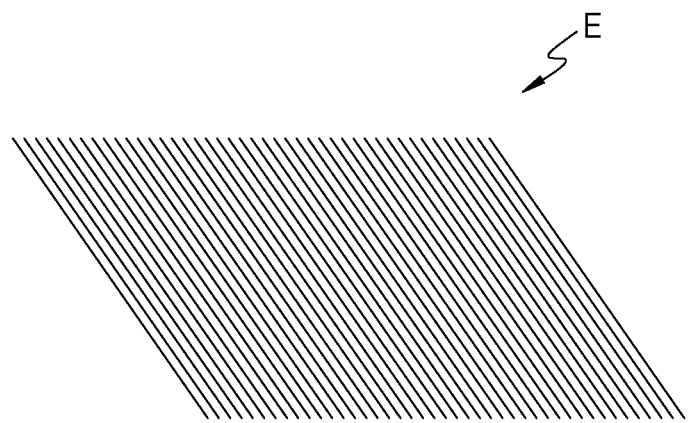
Figure 6C:
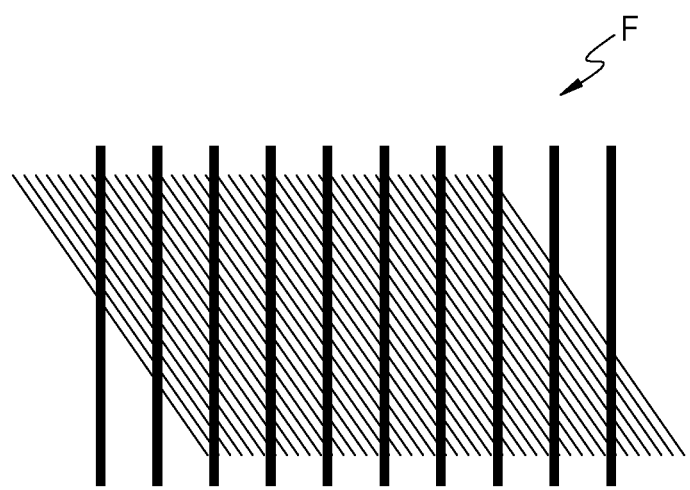
Figure 7A:
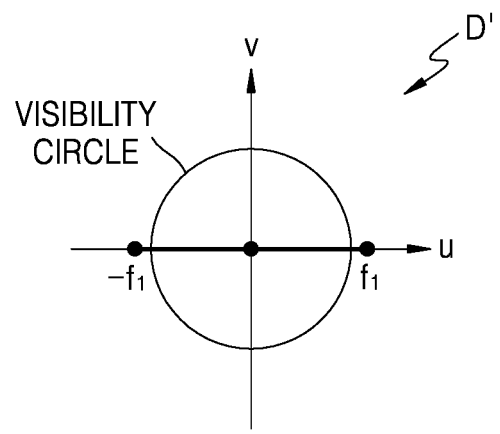
FIGS. 7A to 7C illustrate spatial frequency vector distributions in which the patterns of FIGS. 6A to 6C are expressed through Fourier transformation.
Figure 7B:
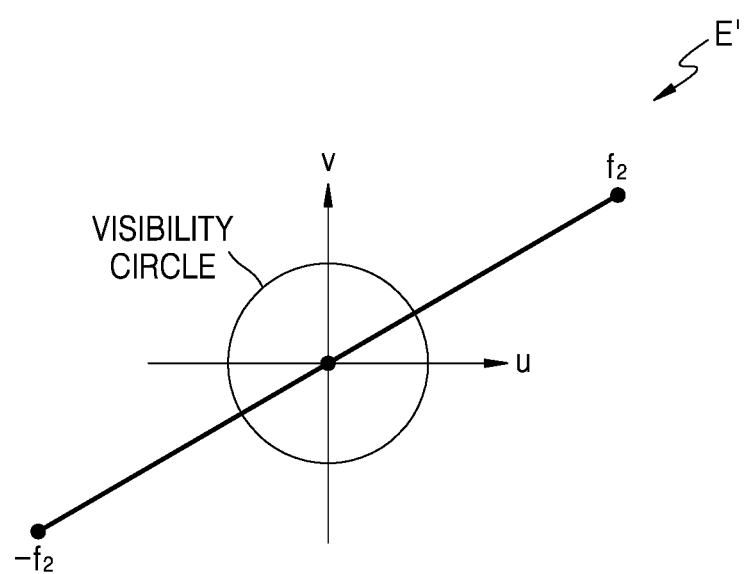
Figure 7C:
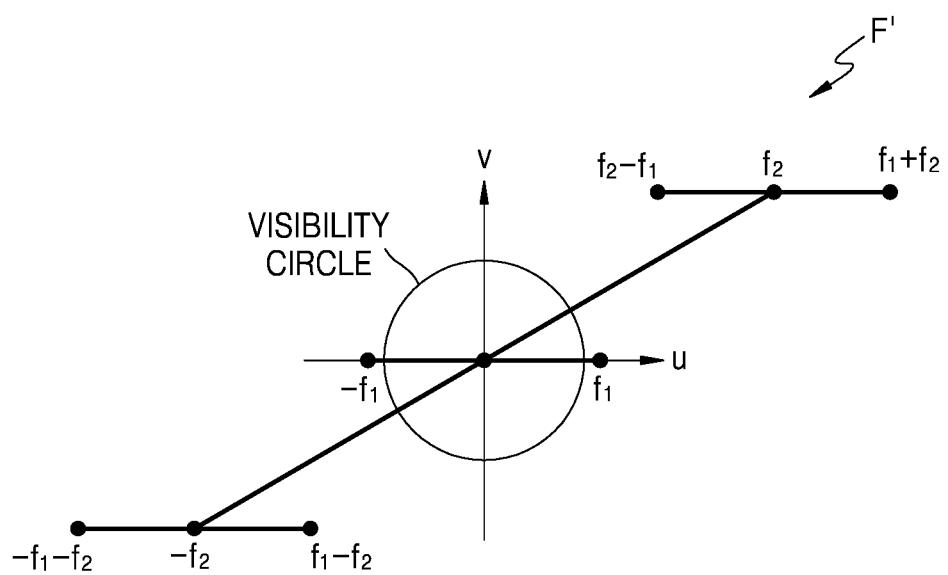

FIGS. 6A to 6C illustrate real-space patterns for explaining cases in which a moiré pattern is not visible. FIGS. 7A to 7C illustrate spatial frequency vector distributions in which the patterns of FIGS. 6A to 6C are expressed through Fourier transform. In FIGS. 7A to 7C, u and v represent directions, and $f_1$ and $f_2$ respectively represent a first-direction frequency vector and a second-direction frequency vector.

FIG. 6A illustrates a first pattern D formed in the vertical direction. FIG. 7A illustrates a first spatial frequency vector distribution D' in which the first pattern D of FIG. 6A is expressed through Fourier transform. FIG. 6B illustrates a second pattern E tilted at a certain angle with respect to the vertical direction. FIG. 7B illustrates a second spatial frequency vector distribution E' in which the second pattern E of FIG. 6B is expressed through Fourier transform. Here, a pitch of the second pattern E may be significantly smaller than that of the first pattern D.

FIG. 6C illustrates a third pattern F formed by overlapping the first pattern D of FIG. 6A and the second pattern E of FIG. 6B. FIG. 7C illustrates a third spatial frequency vector distribution F' obtained from the convolution sum of frequency vectors illustrated in FIG. 7A and frequency vectors illustrated in FIG. 7B.

Referring to FIG. 7C, frequency vectors of the third spatial frequency vector distribution F' corresponding to the moiré pattern are located outside the visibility circle. Thus, the moiré pattern is not visible from the third pattern F formed by overlapping the first pattern D of FIG. 6A and the second pattern E of FIG. 6B. As described above, if the difference between the pitch of first pattern D and the pitch of the second pattern E is large and the second pattern E is formed at a certain angle with respect to the first pattern D, the moiré pattern may not be visible even when the first pattern D and the second pattern E overlap each other.

In the pattern structure 100 of FIG. 1, even if the first pitch P1 of the first element pattern and the second pitch P2 of the second element pattern are similar, the moiré pattern occurring due to the overlapping of the first element pattern and the second element pattern may be prevented from being visible when the filling layer 140 having similar transmittance to those of the second elements 130 is provided among the second elements 130, between adjacent ones thereof. In detail, when the filling layer 140 is provided among the second elements 130, the second element pattern may not be optically visible due to the similar transmittances of the second elements 130 and the filling layer 140. Thus, since the second element pattern is not visible due to the filling layer 140, the moiré pattern may not be visible when the second element pattern overlaps the first element pattern. This may be seen from a fact that frequency vectors corresponding to the moiré pattern in the spatial frequency vector distribution obtained from the convolution sum of the spatial frequency vectors of the first element pattern and the spatial frequency vectors of the second element pattern are not located inside the visibility circle.

For example, in a high-resolution display apparatus such as a smart phone or a smart watch, in which a fingerprint sensor is mounted on a display panel, a pixel pattern of the display panel may have a pitch of about 100 μm or less. When electrode patterns of the fingerprint sensor have a pitch of about 1 mm or less (particularly, a pitch of about 100 μm or less), the moiré pattern occurring due to the overlapping of the pixel pattern and the electrode patterns is visible. In a related art, the pixel pattern and the electrode patterns are aligned with each other to prevent the visibility of the moiré pattern. In contrast, according to the present example embodiment, the visibility of a moiré pattern occurring due to the overlapping of a pixel pattern and electrode patterns may be prevented by providing a filling layer having similar transmittance to those of electrode patterns between the electrode patterns without aligning the electrode patterns and the pixel pattern.

Figure 8:
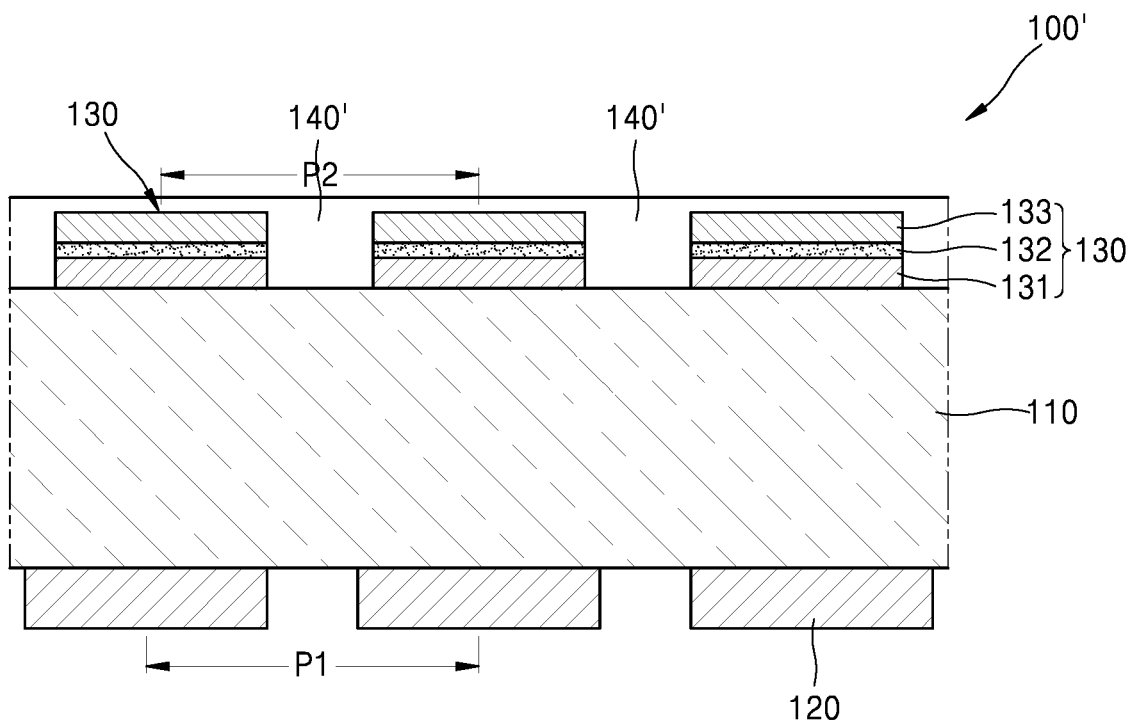
FIG. 8 illustrates a pattern structure for preventing a moiré pattern from becoming visible, according to another example embodiment.

FIG. 8 illustrates a pattern structure for preventing the visibility of moiré according to another example embodiment.

Referring to FIG. 8, in a pattern structure 100', a first element pattern, having a plurality of first elements 120 arranged regularly at a first pitch P1, is provided on a bottom surface of a transparent substrate 110, and a second element pattern, having a plurality of second elements 130 arranged regularly at a second pitch P2, is provided on a top surface of the transparent substrate 110.

A filling layer 140' may be provided to fill gaps among the second elements 130 of the second element pattern, between adjacent ones thereof. Here, the filling layer 140' may fill spaces among the second elements 130 and may also cover the second elements 130. The filling layer 140' may be formed to have a higher height than the second elements 130. The filling layer 140' may have similar transmittance to those of the second elements 130 of the second element pattern as described above. In detail, the difference between transmittances (or reflectances) of the second elements 130 and the filling layer 140' may be about 5% or less.

As described above, the first pitch P1 of the first element pattern and the second pitch P2 of the second element pattern may be values at which a moiré pattern occurring due to the overlapping of the first and second element patterns becomes visible when the filling layer 140' is not provided. However, as the filling layer 140' having similar transmittance to that of the second elements 130 is provided to fill gaps among the second elements 130, the visibility of the moiré pattern occurring due to the overlapping of the first and second element patterns may be prevented.

Figure 9:
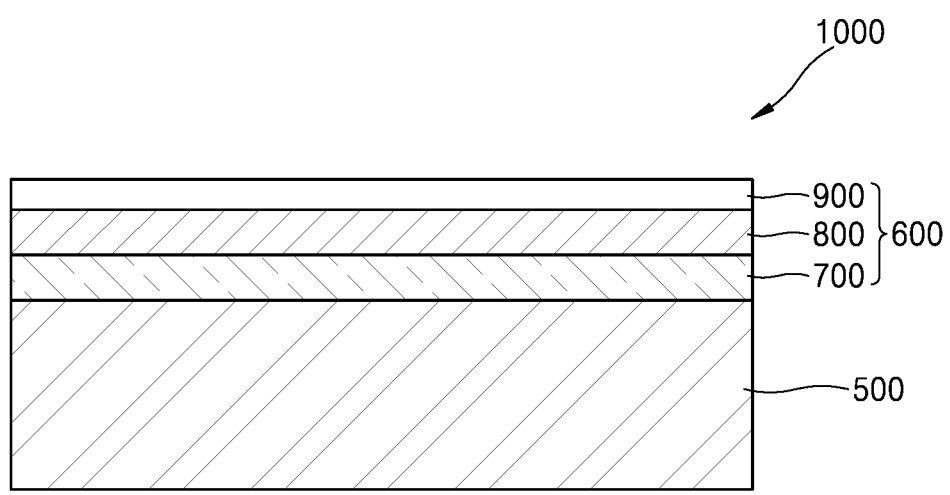
FIG. 9 illustrates a display apparatus according to an example embodiment.

FIG. 9 illustrates a display apparatus according to an example embodiment. A display apparatus 1000 illustrated in FIG. 1 may be employed, for example, in an electronic device such as a smart phone, a smart watch, a tablet PC, or a laptop computer but is not limited thereto.

Referring to FIG. 9, the display apparatus 1000 may include a display panel 500 which displays color images, and a sensor 600 provided on the display panel 500. A transparent adhesive layer (not shown), e.g., an optically clear adhesive (OCA) or optically clear resin (OCR), may be provided between the display panel 500 and the sensor 600.

The display panel 500 may include, for example, an organic light-emitting display panel or a liquid crystal display panel but is not limited thereto. As will be described below, the display panel 500 may include a pixel pattern 510, as shown in FIGS. 10 and 11, in which a plurality of pixels PX are regularly arranged at a first pitch P1.

Figure 13:
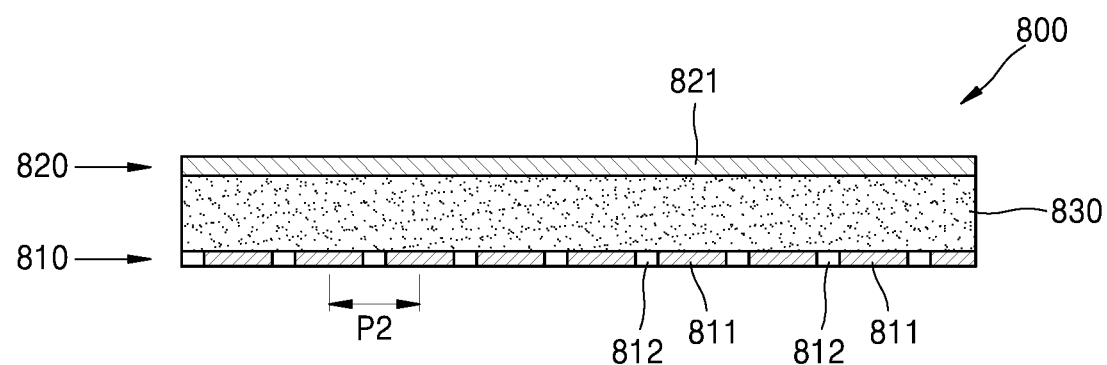
FIG. 13 is a cross-sectional view of a sensor part of a sensor illustrated in FIG. 9.

The sensor 600 may include, for example, a fingerprint sensor or a fingerprint-touch composite sensor but is not limited thereto. The sensor 600 may be a capacitive sensor. The sensor 600 may include a sensor part 800 and a protective layer 900 stacked on a transparent substrate 700. The transparent substrate 700 may be a reinforced substrate including, for example, glass, poly(methylmethacrylate) (PMMA), poly carbonate (PC), or polyethylene terephthalate (PET), or the like but is not limited thereto. The sensor part 800 may include an electrode pattern in which a plurality of electrodes 811 and 821 are regularly arranged at a second pitch P2, as will be described below, and as illustrated in FIG. 13.

Figure 10:
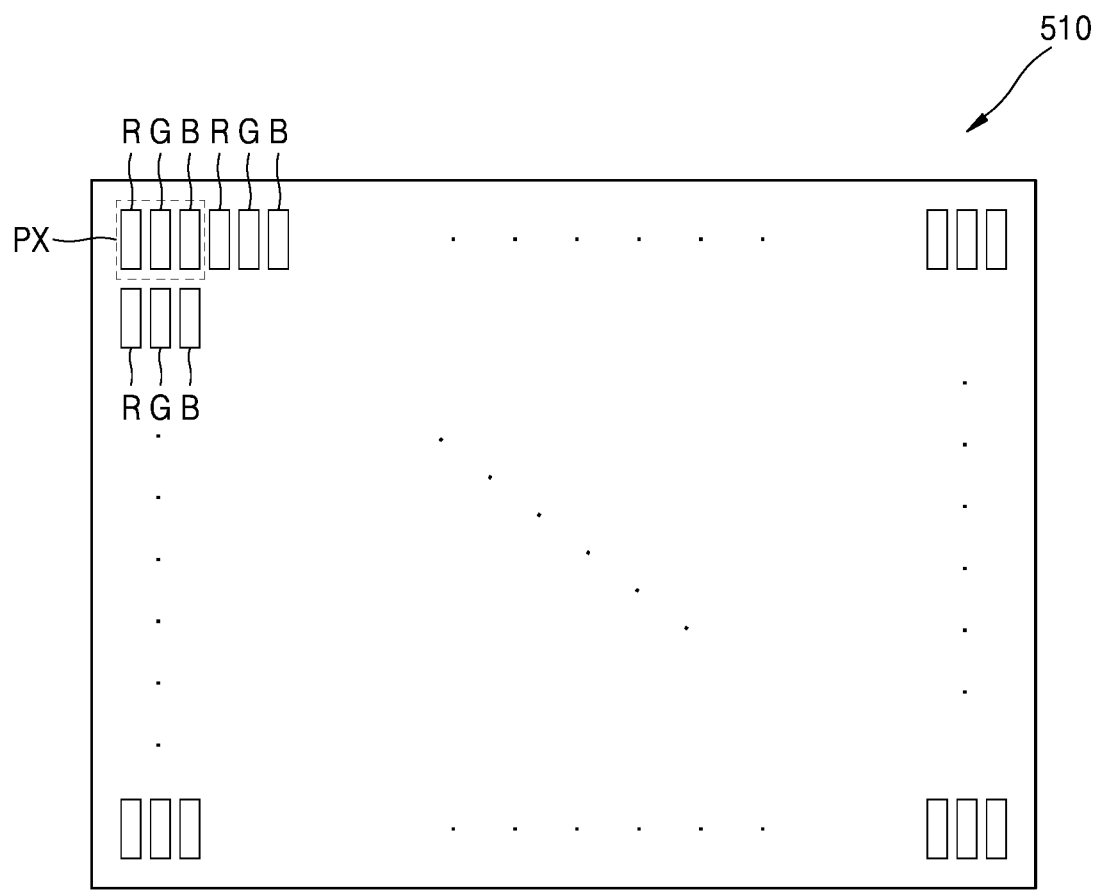
FIG. 10 illustrates a pixel pattern of a display panel of FIG. 9.

FIG. 10 illustrates a pixel pattern of a display panel such as that of FIG. 9. FIG. 11 is an enlarged view of a part of the pixel pattern of FIG. 10.

Figure 11:
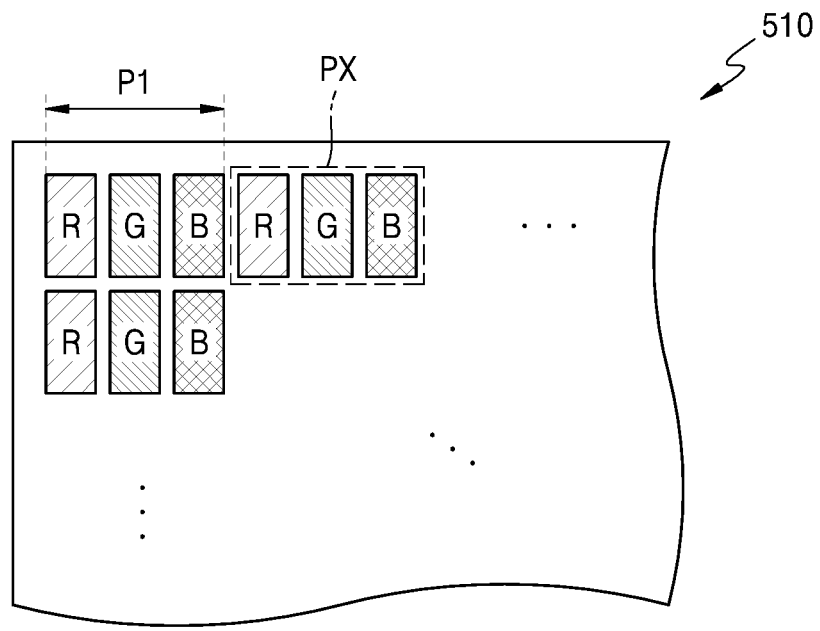
FIG. 11 is an enlarged view of a part of the pixel pattern of FIG. 10.

Referring to FIGS. 10 and 11, a pixel pattern 510 may have a structure in which a plurality of pixels PX are regularly arranged at a first pitch P1. Here, each of the pixels PX may include different color subpixels, e.g., red, green, and blue subpixels R, G, and B. Here, the red, green, and blue subpixels R, G, and B may be sequentially arranged in one direction.

Figure 12:
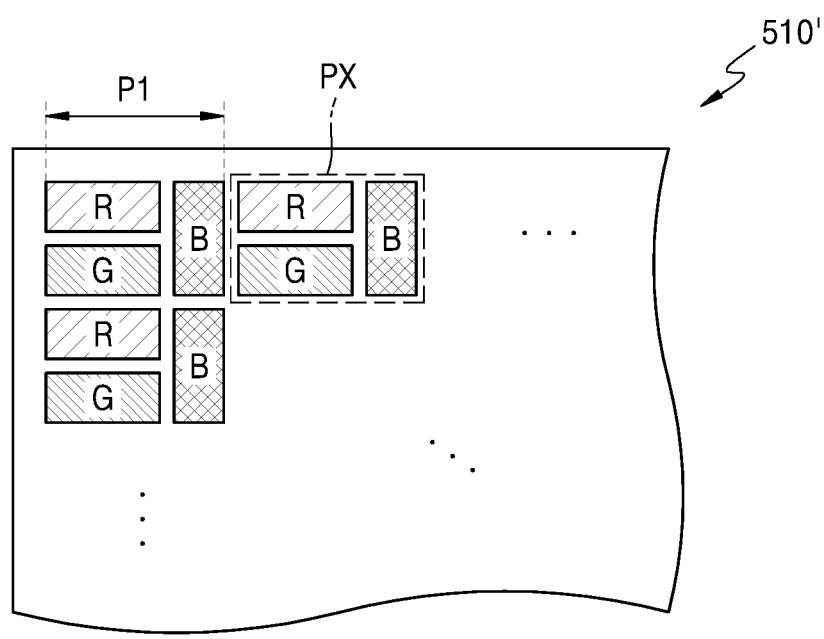
FIG. 12 illustrates another example of a pixel pattern applicable to the display panel of FIG. 9.

FIG. 12 illustrates another example of a pixel pattern applicable to the display panel 500 of FIG. 9. Referring to FIG. 12, a pixel pattern 510' may have a structure in which a plurality of pixels PX are regularly arranged at a first pitch P1. Each of the pixels PX may include different color subpixels, e.g., red, green and blue subpixels R, G, and B. Here, the green subpixel G may be located below the red subpixel R, and the blue subpixel B may be located at a side of the red and green subpixels R and G. Here, the sizes and shapes of the red, green and blue subpixels R, G, and B may be differently set in units of colors for display quality and optimal brightness.

An arrangement of the red, green and blue subpixels R, G, and B described above is merely an example and thus the red, green and blue subpixels R, G, and B may be arranged in any of various other forms. Furthermore, an example in which each of the pixels PX includes the red, green and blue subpixels R, G, and B has been described above but each of the pixels PX may include subpixels of various other colors. For example, each of the pixels PX may include white, cyan, magenta, and yellow subpixels.

FIG. 13 is a cross-sectional view of a sensor part of a sensor such as that of FIG. 9.

Referring to FIG. 13, a sensor part 800 may include a dielectric layer 830, a first electrode layer 810 located on a bottom surface of the dielectric layer 830, and a second electrode layer 820 located on a top surface of the dielectric layer 830. The first electrode layer 810 may include a first electrode pattern including a plurality of first electrodes 811 arranged regularly at a second pitch P2, and a first filling layer 812 provided to fill gaps among the first electrodes 811, between adjacent ones thereof. The second electrode layer 820 may include a second electrode pattern with a plurality of second electrodes 821 arranged regularly at the second pitch P2, and a second filling layer (not shown) provided to fill gaps among the second electrodes 821, between adjacent ones thereof.

Figure 14:
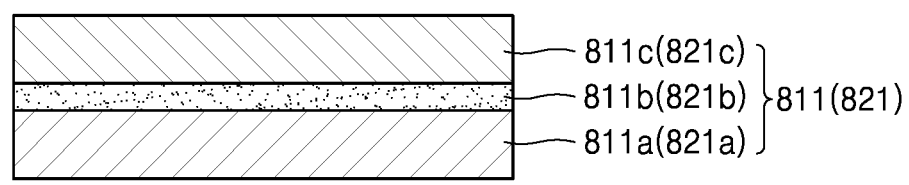
FIG. 14 is a cross-sectional view of first and second electrodes of the sensor part of FIG. 13.

FIG. 14 is a cross-sectional view of the first and second electrodes 811 and 821 of the sensor part of FIG. 13. Referring to FIG. 14, the first and second electrodes 811 and 821 may include an oxide-metal-oxide (OMO) material. In detail, the first electrode 811 may include a first oxide layer 811a, a metal layer 811b, and a second oxide layer 811c, and the second electrode 821 may include a first oxide layer 821a, a metal layer 821b, and a second oxide layer 821c. The OMO material may have a transmittance of 90% or more and a sheet resistance of 10 $\Omega sq^{-1}$ or less.

The first oxide layers 811a and 821a may include an oxide having a refractive index of about 2.0 to 2.7, and a thickness of about 18 nm to 50 nm. As a concrete example, the first oxide layers 811a and 821a may include, but are not limited to, at least one among an indium-tin oxide (ITO), an indium-zinc oxide (IZO), an Al-doped ZnO (AZO), a Ga-doped ZnO (GZO), an indium-tin-zinc oxide (ITZO), a zinc-tin oxide (ZTO), an indium-gallium oxide (IGO), $SnO_2$, $TiO_2$, $Nb_2O_5$, ZnO, $ZrO_2$ and $HfO_2$.

The metal layers 811b and 821b may have a thickness, for example, a thickness of about 5 nm to 10 nm, which is less than that of the first oxide layers 811a and 821a and the second oxide layers 811c and 821c. As a concrete example, the metal layers 811b and 821b may include an Ag or Ag alloy. Here, the Ag alloy may include, but is not limited to, a binary metal system such as Ag—Al, Ag—Mo, Ag—Au, Ag—Pd, Ag—Ti, or Ag—Cu or a ternary metal system such as Ag—Au—Pd or Ag—Au—Cu.

The second oxide layers 811c and 821c may include the same material as the first oxide layers 811a and 821a or a material having a refractive index less than that of the first oxide layers 811a and 821a. The second oxide layers 811c and 821c may include an oxide having a refractive index of about 1.8 to 2.2 and a thickness of about 35 nm to 53 nm. As a concrete example, the second oxide layers 811c and 821c may include, but are not limited to, at least one material from among an indium-tin oxide (ITO), an indium-zinc oxide (IZO), an Al-doped ZnO (AZO), a Ga-doped ZnO (GZO), an indium-tin-zinc oxide (ITZO), a zinc-tin oxide (ZTO), an indium-gallium oxide (IGO), $SnO_2$ and ZnO.

Referring to FIG. 13, the first filling layer 812 provided among the first electrodes 811 may include a material having a transmittance similar to that of the first electrodes 811 to prevent the visibility of the first electrode pattern. In detail, the first filling layer 812 may include a material having a transmittance that is different from that of the first electrodes 812 by about 5% or less. The first filling layer 812 may include an insulating material having a refractive index of about 1.6 to 2.0. As a concrete example, the first filling layer 812 may include an inorganic oxide such as MgO, $Ta_2O_3$, SiON, or $SiO_2$ or an organic insulating material. Similar to the first filling layer 812, the second filling layer provided among the second electrodes 821 may include a material having similar transmittance to that of the second electrodes 821 to prevent the visibility of the second electrode pattern. The second filling layer may include the same material as the first filling layer 812.

The first electrodes 811 and the second electrodes 821 may intersect each other at a certain angle, e.g., at a right angle, while having the dielectric layer 830 therebetween.

Figure 15:
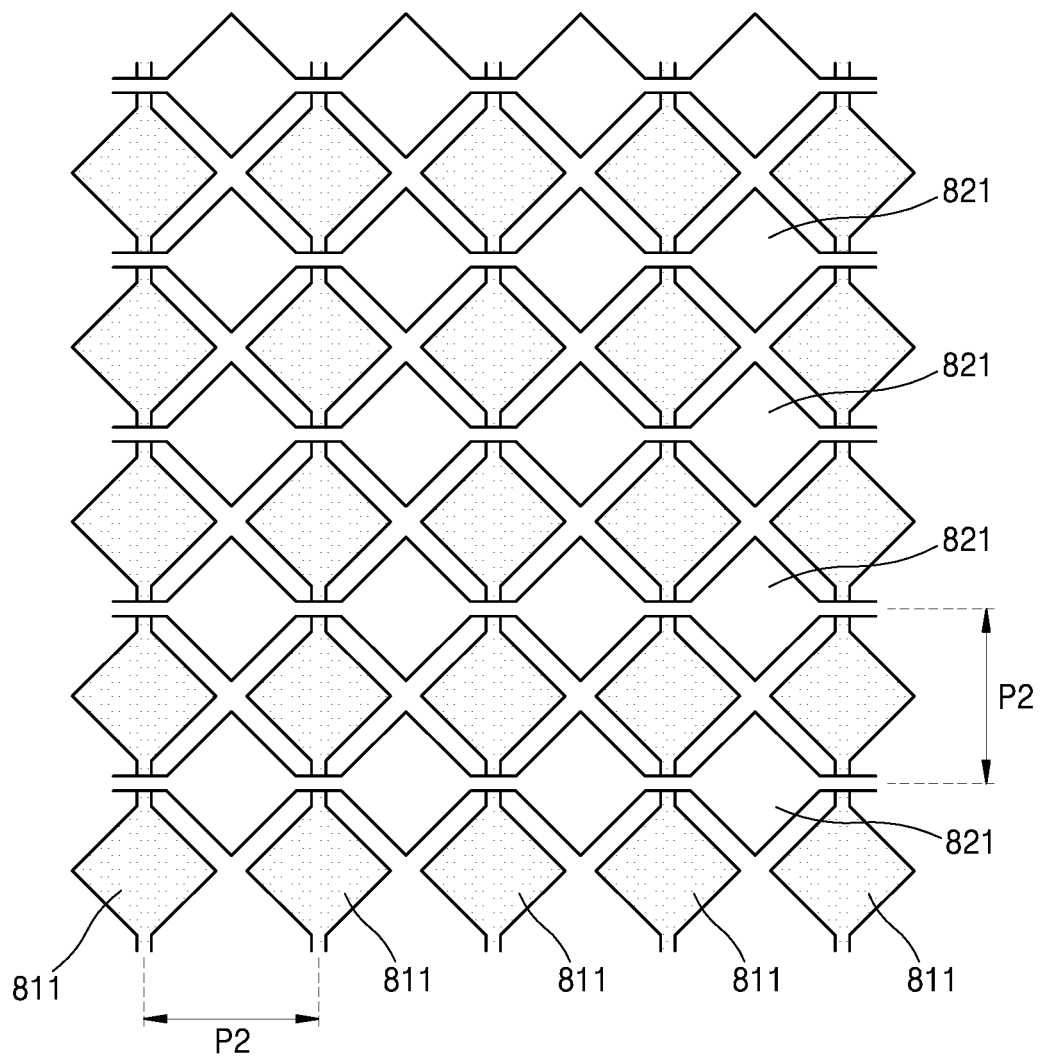
FIG. 15 is a plan view of electrode patterns of the sensor part of FIG. 13.

FIG. 15 is a plan view of electrode patterns of a sensor part such as that of FIG. 13. Referring to FIG. 15, the electrode patterns may include a first electrode pattern and a second electrode pattern arranged to intersect each other with the dielectric layer 830 of FIG. 13 therebetween. The first electrode pattern may include first electrodes 811 arranged regularly in a first direction (vertically, in FIG. 15) at a second pitch P2. Here, the first electrodes 811 may be, for example, in the form of a plurality of diamonds connected to each other. However, the first electrodes 811 are not limited thereto and may be in any of various other forms. The second electrode pattern may include a second electrodes 821 arranged regularly in a second direction (horizontally, in FIG. 15) perpendicular to the first direction at the second pitch P2. Here, similar to the first electrodes 811, the second electrodes 821 may be, for example, in the form of a plurality of diamonds connected to each other but are not limited thereto.

Figure 16:
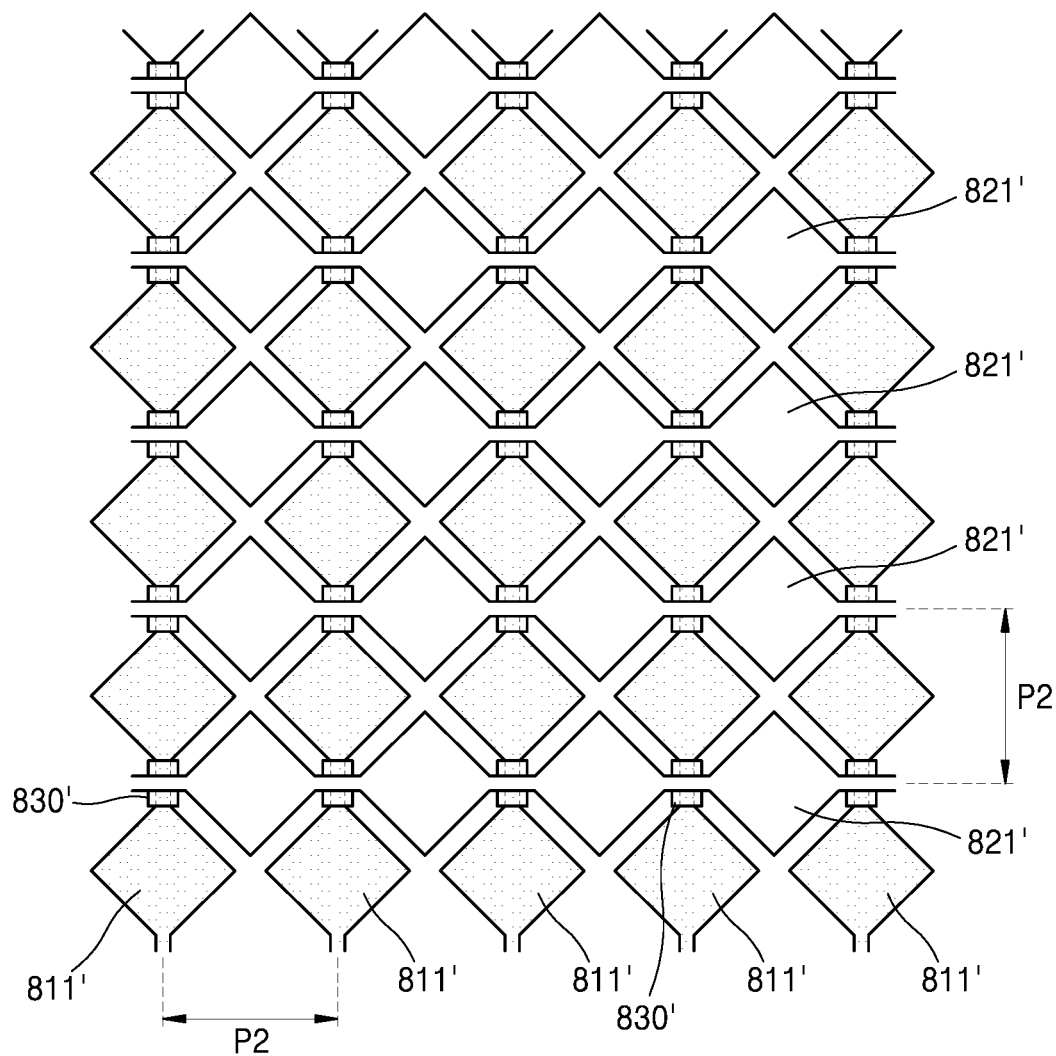
FIG. 16 is a plan view of another example of a sensor part applicable to the sensor of FIG. 9.
Figure 17:
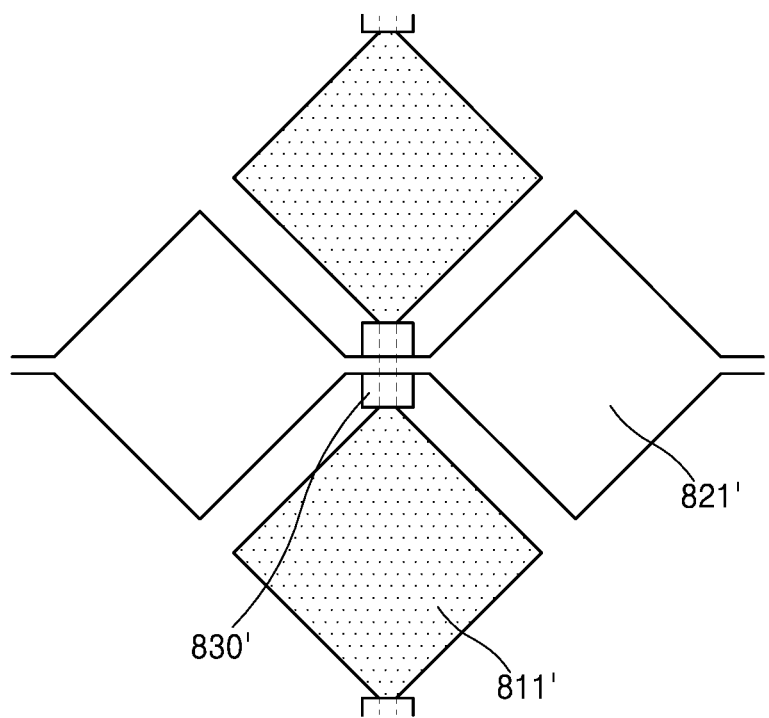
FIG. 17 is an enlarged view of a part of the sensor part of FIG. 16.

FIG. 16 is a plan view of another example of a sensor part applicable to the sensor of FIG. 9. FIG. 17 is an enlarged view of a part of the sensor part of FIG. 16.

Referring to FIGS. 16 and 17, a first electrode pattern and a second electrode pattern are provided on a same plane, unlike in the sensor part 800 of FIG. 13. In detail, the first electrode pattern may include first electrodes 811' arranged regularly at a second pitch P2 in a first direction (vertically, in FIG. 16). Here, the first electrodes 811' may be, for example, in a form of a plurality of diamonds connected to each other but are not limited thereto.

The second electrode pattern may be provided on the same plane as the first electrode pattern. The second electrode pattern may include second electrodes 821' arranged regularly at the second pitch P2 in a second direction (horizontally, in FIG. 16) perpendicular to the first direction. Here, similar to the first electrodes 811', the second electrodes 821' may be in a form of a plurality of diamonds connected to each other but are not limited thereto.

In the present example embodiment, as shown in FIG. 17, a dielectric layer 830' may be provided at intersections of the first electrode pattern and the second electrode pattern provided on the same plane. That is, the dielectric layer 830' may be provided between pairs of adjacent ones of the first electrodes 811' and the second electrodes 821' at the intersections of the first electrode pattern and the second electrode pattern.

Figure 18:
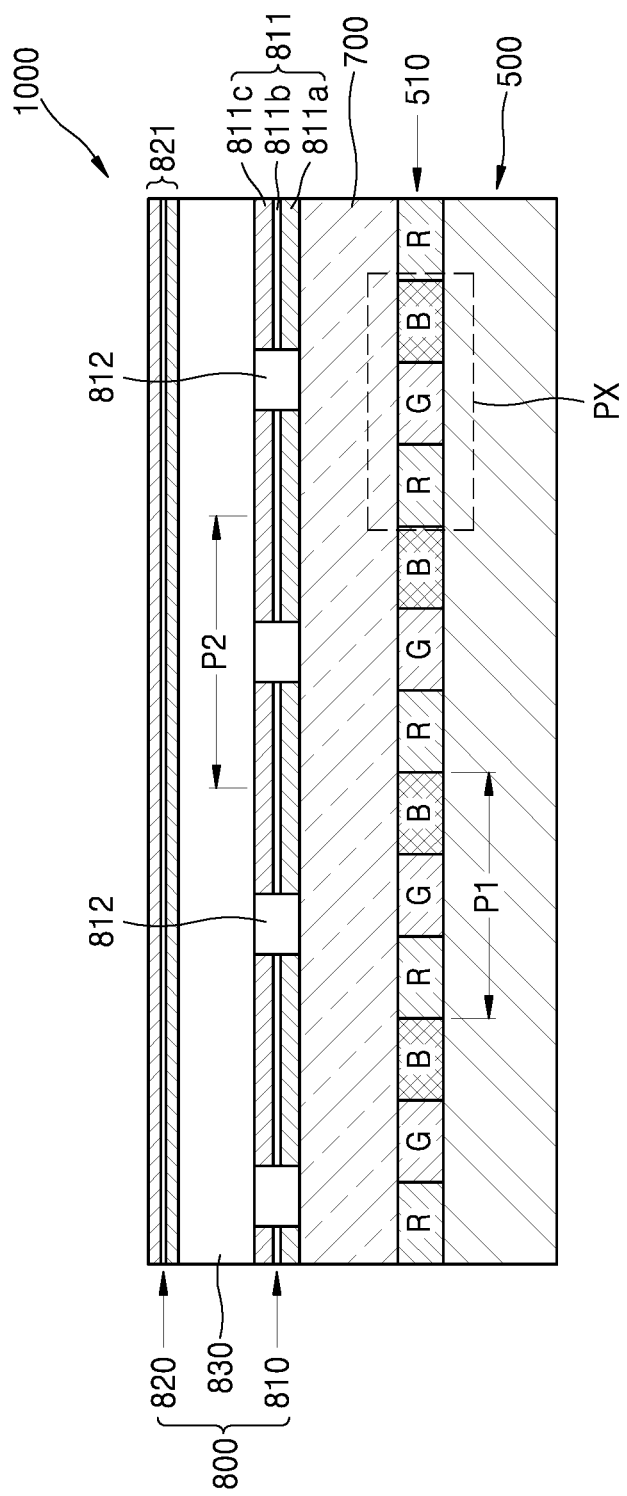
FIG. 18 illustrates the pixel pattern of the display panel and the electrode patterns of the sensor of the display apparatus of FIG. 9.

FIG. 18 illustrates a pixel pattern of a display panel and electrode patterns of a sensor of a display apparatus such as that of FIG. 9. In FIG. 18, a transparent protective layer which protects a sensor part 800 is not illustrated for convenience of explanation.

Referring to FIG. 18, a display apparatus 1000 may include a display panel 500 including a pixel pattern 510, and the sensor 600 of FIG. 9 provided on the display panel 500 and including the electrode patterns.

The display panel 500 may include, for example, an organic light-emitting display panel or a liquid crystal display panel which displays color images. The display panel 500 may include the pixel pattern 510 in which a plurality of pixels PX are arranged regularly at a first pitch P1. For example, in the display apparatus 1000 which is a high-resolution display apparatus, the first pitch P1 of the pixel pattern 510 may be about 100 μm but is not limited thereto.

The sensor 600 may include, for example, a fingerprint sensor or a fingerprint-touch composite sensor. The sensor 600 may include a sensor part 800 provided on a transparent substrate 700. The sensor part 800 may include electrode patterns having a first electrode pattern and a second electrode pattern. For convenience of illustration, the protective layer 900 is not illustrated in FIG. 18.

In detail, the sensor part 800 may include a dielectric layer 830, a first electrode layer 810 provided on a bottom surface of the dielectric layer 830, and a second electrode layer 820 provided on a top surface of the dielectric layer 830. Here, the first electrode layer 810 may include a first electrode pattern with a plurality of first electrodes 811 arranged regularly at a second pitch P2, and a first filling layer 812 provided to fill gaps among the first electrodes 811, disposed between adjacent ones thereof. Here, the first filling layer 812 may be formed among the first electrodes 811 and at a same height as or at a lower height than that the first electrodes 811. The second electrode layer 820 may include a second electrode pattern with a plurality of second electrode 821 arranged regularly, at a second pitch P2, and in a direction intersecting a direction in which the first electrodes 811 are arranged, and a second filling layer (not shown) provided to fill gaps among the second electrodes 821, disposed between adjacent ones thereof. The second filling layer may be formed among second electrodes 821 and at the same height as the second electrodes 821 or at a lower height than that of the second electrodes 821.

The first pitch P1 of the pixel pattern 510 and the second pitch P2 of the electrode patterns may be values at which the moiré pattern occurring due to the overlapping of the electrode patterns and the pixel pattern 510 becomes visible when the first and second filling layers 812 and 822 are not provided. For example, in the display apparatus 1000 which is a high-resolution display apparatus, when the first pitch P1 of the pixel pattern 510 is about 100 μm or less, the second pitch P2 of the electrode pattern may be about 1 mm or less (more particularly, about 100 μm or less).

The first filling layer 812 and the second filling layer may prevent the visibility of the moiré pattern which may occur due to the overlapping of the pixel pattern 510 and the electrode patterns. To this end, the first filling layer 812 and the second filling layer may include a material having similar transmittances to those of the first and second electrodes 811 and 821, respectively, as described above. For example, the first filling layer 812 and the second filling layer may include a material having a transmittance that is different from that of the first and second electrodes 811 and 821, respectively, by about 5% or less.

The visibility of the first electrode pattern may be prevented due to the first filling layer 812, and the visibility of the second electrode pattern may be prevented due to the second filling layer. That is, the electrode patterns of the sensor part 800 may not be visible due to the first filling layer 812 and the second filling layer. Thus, since the electrode patterns are not visible due to the first filling layer 812 and the second filling layer, the moiré pattern may not be visible even when the electrode patterns overlap the pixel pattern 510. As described above, the visibility of the moiré pattern which may occur due to the overlapping of the pixel pattern 510 and the electrode patterns may be prevented using the first filling layer 812 and the second filling layer.

Although a case in which the first and second electrode patterns are provided below and on the dielectric layer 820 has been described above, the first and second electrode patterns may be provided on a same plane as illustrated in FIG. 16. In this case, a filling layer (not shown) may be provided among the first electrodes 811' and among the second electrodes 821' to prevent the visibility of the electrode patterns.

Figure 19:
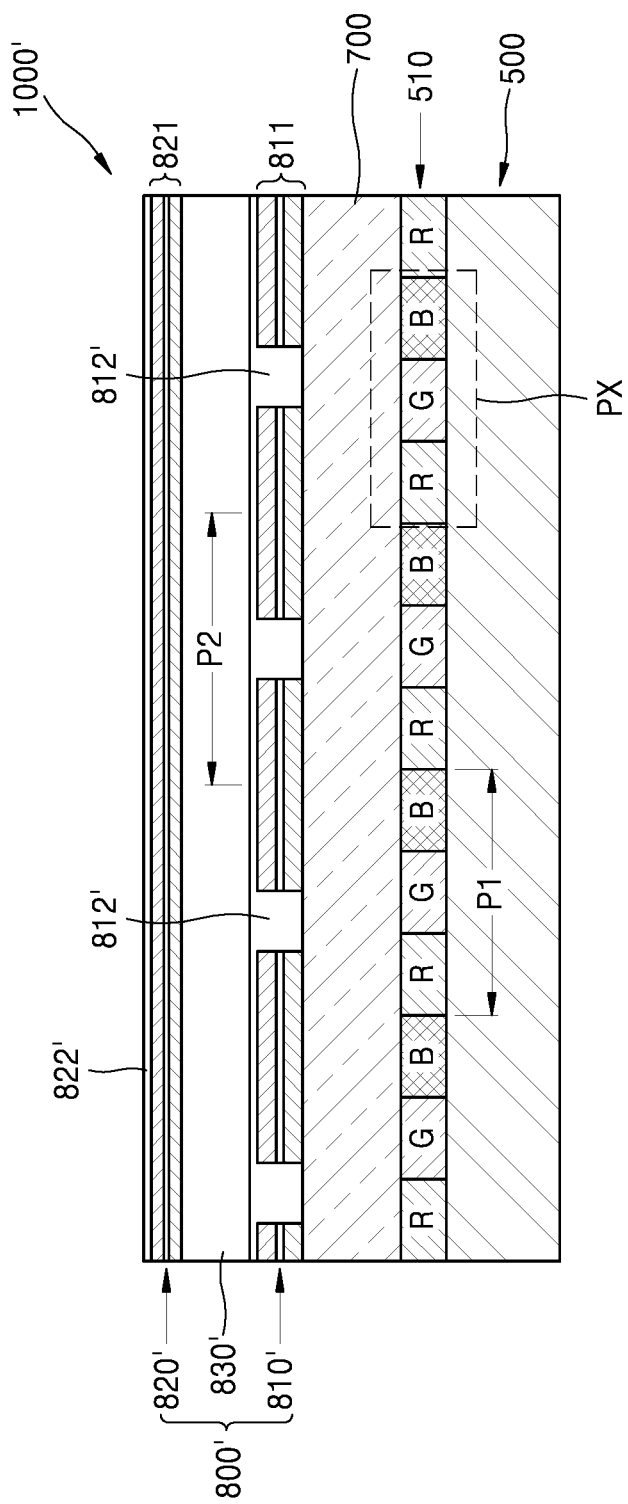
FIG. 19 illustrates a display apparatus according to another example embodiment.

FIG. 19 illustrates a display apparatus according to another example embodiment. A display apparatus 1000' illustrated in FIG. 19 is the same as the display apparatus 1000 of FIG. 18 except that first and second filling layers 812' and 822' cover first and second electrodes 811 and 821, respectively.

Referring to FIG. 19, the display apparatus 1000' may include a display panel 500 including a pixel pattern 510, and the sensor 600 of FIG. 9 provided on the display panel 500 and including electrode patterns. For convenience of illustration, the protective layer 900 is not illustrated in FIG. 18.

The display panel 500 may include the pixel pattern 510 with a plurality of pixels PX arranged regularly at a first pitch P1. A sensor part 800' of the sensor 600 may include first and second electrode patterns. In detail, the sensor part 800' may include a dielectric layer 830', a first electrode layer 810' provided on a bottom surface of the dielectric layer 830', and a second electrode layer 820' provided on a top surface of the dielectric layer 830'. The first electrode layer 810' may include a first electrode pattern with the first electrodes 811 arranged regularly at a second pitch P2, and a first filling layer 812' provided to fill gaps among the first electrodes 811, filling spaces between adjacent ones thereof. Here, the first filling layer 812' may cover the first electrodes 811. That is, the first filling layer 812' may be formed to a higher height than that of the first electrodes 811. The second electrode layer 820' may include a second electrode pattern with the second electrodes 821 arranged regularly at the second pitch P2 to intersect the first electrodes 811, and a second filling layer 822' provided to fill gaps among the second electrodes 821, filling spaces between adjacent ones thereof. Here, the second filling layer 822' may cover the second electrodes 821. That is, the second filling layer 822' may be formed to a higher height than that of the second electrodes 821.

As described above, the first and second filling layers 812' and 822' may include a material having a transmittance that is different from that of the first and second electrodes 811 and 821, respectively, by about 5% or less. Thus, the electrode patterns may not be visible due to the first and second filling layers 812' and 822' and the moiré pattern occurring due to the overlapping of the electrode patterns and the pixel pattern 510 may not be visible.

Although a case in which the first and second electrode patterns are provided below and on the dielectric layer 830' has been described above, the first and second electrode patterns may be provided on the same plane as illustrated in FIG. 16. In this case, a filling layer (not shown) may be provided to cover the first electrodes 811 second electrodes 821 so as to prevent the visibility of the electrode patterns.

Figure 20:
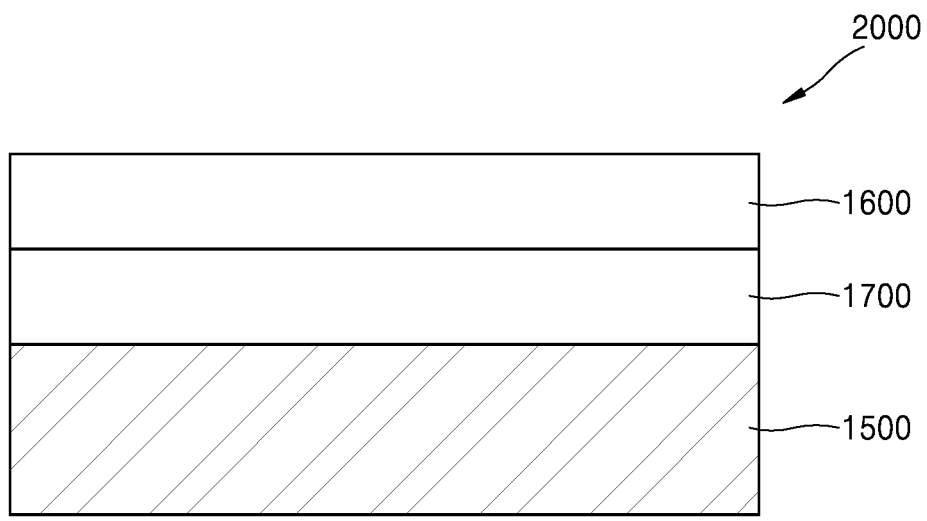
FIG. 20 illustrates a display apparatus according to another example embodiment.

FIG. 20 illustrates a display apparatus according to another example embodiment.

Referring to FIG. 20, a display apparatus 2000 may include a display panel 1500, a first sensor 1600 provided on the display panel 1500, and a second sensor 1700 provided between the display panel 1500 and the first sensor 1600.

The display panel 1500 may include, for example, an organic light-emitting display panel or a liquid crystal display panel which display color images. The display panel 1500 may include a pixel pattern having a first pitch. The display panel 1500 is as described above and is thus not described in detail here.

The first sensor 1600 may be, for example, a fingerprint sensor. The first sensor 1600 includes electrode patterns having a second pitch, and a filling layer provided among electrodes to prevent the electrode patterns from being visible. The first sensor 1600 is the same as the sensors described above and is thus not described in detail here.

The second sensor 1700 may be, for example, a touch sensor. The second sensor 1700 includes a touch electrode pattern (not shown) having a certain pitch. The second sensor 1700 has the same structure as the first sensor 1600 but the touch electrode pattern of the second sensor 1700 may have a pitch that is large enough to prevent the moiré pattern from being visible when the pixel pattern of the display panel 1500 and the electrode patterns of the first sensor 1600 overlap each other. For example, in the display apparatus 2000 which is a high-resolution display apparatus, the pixel pattern of the display panel 1500 may have a pitch of about 100 μm or less and the electrode patterns of the first sensor 1600 which is a fingerprint sensor may have a pitch of about 1 mm (more particularly, 100 μm) or less. The touch electrode pattern of the second sensor 1700 which is a touch sensor may have a comparatively large pitch of about 4 mm or more.

In the display apparatus 2000 as described above, the moiré pattern may not be visible due to the comparatively large pitch of the second sensor 1700 which is a touch sensor even when the second sensor 1700 overlaps the display panel 1500 or the first sensor 1600. Furthermore, the first sensor 1600 includes the filling layer for preventing the visibility of the electrode patterns as described above and thus the visibility of the moiré pattern may be prevented even when the first sensor 1600 overlaps the display panel 1500 or the second sensor 1700.

In a high-resolution display apparatus, the moiré pattern is visible when a pixel pattern of a display panel and electrode patterns of a fingerprint sensor (or a fingerprint-touch composite sensor) overlap each other. In this case, the visibility of the moiré pattern due to the overlapping of the pixel pattern and the electrode patterns may be prevented by providing a filling layer having similar transmittance to those of electrodes of the electrode patterns among the electrodes, between adjacent ones thereof.

According to the one or more of the above example embodiments, when a first element pattern with first elements arranged regularly at a first pitch and a second element pattern with second elements arranged regularly at a second pitch overlap each other, a filling layer having similar transmittance to those of the first elements is provided among the first elements, between adjacent ones thereof, or a filling layer having similar transmittance to those of the second elements is provided among the second elements, between adjacent ones thereof. Thus, the visibility of the moiré pattern which may occur due to the overlapping of the first element pattern and the second element pattern may be prevented.

In a high-resolution display apparatus, the moiré pattern is visible when a pixel pattern of a display panel and electrode patterns of a fingerprint sensor (or a fingerprint-touch composite sensor) overlap each other. In this case, a filing layer having a transmittance similar to that of electrodes of the electrode patterns may be provided on the electrodes to prevent the visibility of the moiré pattern which may occur due to the overlapping of the pixel pattern and the electrode patterns.

It should be understood that example embodiments described herein should be considered in a descriptive sense only and not for purposes of limitation. Descriptions of features or aspects within each embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A pattern structure comprising:
   a first element pattern comprising a plurality of first elements arranged at a first pitch;
   a second element pattern including a plurality of second elements arranged at a second pitch, wherein the second element pattern overlaps with the first element pattern; and
   a filling layer filling gaps between adjacent ones of the plurality of second elements,
   wherein a difference between a transmittance of the plurality of second elements and a transmittance of the filling layer is about 5% or less, and
   wherein the plurality of second elements each comprise a first oxide layer, a metal layer and a second oxide layer which are sequentially stacked.

2. The pattern structure of claim 1, wherein the first pitch and the second pitch are values such that, absent the filling layer, a moiré pattern is formed by the overlap of the first element pattern and the second element pattern.

3. The pattern structure of claim 1, further comprising a transparent substrate disposed between the first element pattern and the second element pattern.

4. The pattern structure of claim 1, wherein the filling layer covers the plurality of second elements.

5. A pattern structure comprising:
   a first element pattern comprising a plurality of first elements arranged at a first pitch;

a second element pattern including a plurality of second elements arranged at a second pitch, wherein the second element pattern overlaps with the first element pattern; and a filling layer filling gaps between adjacent ones of the plurality of second elements, wherein a difference between a transmittance of the plurality of second elements and a transmittance of the filling layer is about 5% or less, and wherein the transmittance of the plurality of second elements is about 90% or more.

6. A display apparatus comprising:

a display panel comprising a pixel pattern comprising a plurality of pixels arranged regularly at a first pitch; and a first sensor provided on the display panel, wherein the first sensor comprises:

an electrode pattern comprising a plurality of electrodes arranged regularly at a second pitch; and a filling layer filling gaps between adjacent ones of the plurality of electrodes, wherein a difference between a transmittance of the plurality of electrodes and a transmittance of the filling layer is about 5% or less, and wherein the plurality of electrodes each comprise a first oxide layer, a metal layer, and a second oxide layer which are sequentially stacked.

7. The display apparatus of claim 6, wherein the filling layer covers the plurality of electrodes.

8. The display apparatus of claim 6, wherein the transmittance of the plurality of electrodes is about 90% or more and a sheet resistance of the plurality of electrodes is about 10 Ωsq−1 or less.

9. The display apparatus of claim 6, wherein the filling layer comprises one of an inorganic oxide and an organic insulating material.

10. The display apparatus of claim 6, wherein the first sensor comprises one of a fingerprint sensor and a fingerprint-touch composite sensor.

11. The display apparatus of claim 6, further comprising a second sensor disposed between the display panel and the first sensor.

12. The display apparatus of claim 11, wherein the first sensor comprises a fingerprint sensor, and the second sensor comprises a touch sensor.

13. A display apparatus comprising:

a display panel comprising a pixel pattern comprising a plurality of pixels arranged regularly at a first pitch; and a first sensor provided on the display panel, wherein the first sensor comprises:

an electrode pattern comprising a plurality of electrodes arranged regularly at a second pitch; and a filling layer filling gaps between adjacent ones of the plurality of electrodes, wherein a difference between a transmittance of the plurality of electrodes and a transmittance of the filling layer is about 5% or less, wherein the first pitch and the second pitch are values such that, absent the filling layer, a moiré pattern is formed by an overlap of the pixel pattern and the electrode pattern, the first pitch being about 100 μm or less, and the second pitch being about 1 mm or less.

14. The display apparatus of claim 6, wherein the first oxide layer comprises at least one material selected from a group consisting of indium-tin oxide (ITO), indium-zinc oxide (IZO), Al-doped ZnO (AZO), Ga-doped ZnO (GZO), indium-tin-zinc oxide (ITZO), zinc-tin oxide (ZTO), indium-gallium oxide (IGO), SnO2, TiO2, Nb2O5, ZnO, ZrO2 and HfO2.

15. The display apparatus of claim 6, wherein the metal layer comprises one of Ag and an Ag alloy.

16. The display apparatus of claim 6, wherein the second oxide layer comprises one of a same material as a material of the first oxide layer and a material having a refractive index lower than a refractive index of the first oxide layer.

17. The display apparatus of claim 16, wherein the second oxide layer comprises at least one material selected from a group consisting of indium-tin oxide (ITO), indium-zinc oxide (IZO), Al-doped ZnO (AZO), Ga-doped ZnO (GZO), indium-tin-zinc oxide (ITZO), zinc-tin oxide (ZTO), indium-gallium oxide (IGO), SnO2, and ZnO.

* * * * *